United States Patent
Liao et al.

(10) Patent No.: US 8,890,225 B2
(45) Date of Patent: Nov. 18, 2014

(54) STRUCTURE AND METHOD FOR SINGLE GATE NON-VOLATILE MEMORY DEVICE HAVING A CAPACITOR WELL DOPING DESIGN WITH IMPROVED COUPLING EFFICIENCY

(75) Inventors: Ta-Chuan Liao, Taichung (TW);
Chien-Kao Yang, Taipei (TW);
Ying-Kit Tsui, Cupertino, CA (US);
Shih-Hsien Chen, Hsinchu (TW);
Liang-Tai Kuo, Zhudong Township, Hsinchu County (TW); Chun-Yao Ko, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 370 days.

(21) Appl. No.: 13/273,505

(22) Filed: Oct. 14, 2011

(65) Prior Publication Data
US 2013/0092991 A1   Apr. 18, 2013

(51) Int. Cl.
*H01L 21/108*   (2006.01)
*H01L 21/336*   (2006.01)
*H01L 29/788*   (2006.01)
*H01L 27/115*   (2006.01)

(52) U.S. Cl.
CPC .......... *H01L 29/788* (2013.01); *H01L 29/7881* (2013.01); *H01L 27/11558* (2013.01); *H01L 27/1156* (2013.01)

USPC .............. 257/298; 257/E27.084; 257/E21.409

(58) Field of Classification Search
USPC ........................... 257/298, E27.084, E21.409
See application file for complete search history.

(56) References Cited

U.S. PATENT DOCUMENTS

| | | | |
|---|---|---|---|
| 7,099,192 B2 | 8/2006 | Wang et al. | |
| 7,423,903 B2 | 9/2008 | Lin et al. | |
| 7,868,370 B2 * | 1/2011 | Lin et al. | 257/298 |
| 8,541,845 B2 * | 9/2013 | Schuetz et al. | 257/360 |

* cited by examiner

*Primary Examiner* — Matthew W Such
*Assistant Examiner* — Monica D Harrison
(74) *Attorney, Agent, or Firm* — Haynes and Boone, LLP (57) ABSTRACT

The NVM device includes a semiconductor substrate having a first region and a second region. The NVM device includes a data-storing structure formed in the first region and designed operable to retain charges. The NVM device includes a capacitor formed in the second region and coupled with the data-storing structure for data operations. The data-storing structure includes a first doped well of a first-type in the semiconductor substrate. The data-storing structure includes a first gate dielectric feature on the first doped well. The data-storing structure includes a first gate electrode disposed on the first gate dielectric feature and configured to be floating. The capacitor includes a second doped well of the first-type. The capacitor includes a second gate dielectric feature on the second doped well. The capacitor also includes a second gate electrode disposed on the second gate dielectric feature and connected to the first gate electrode.

25 Claims, 6 Drawing Sheets

STRUCTURE AND METHOD FOR SINGLE GATE NON-VOLATILE MEMORY DEVICE HAVING A CAPACITOR WELL DOPING DESIGN WITH IMPROVED COUPLING EFFICIENCY

BACKGROUND

In deep sub-micron integrated circuit technology, non-volatile memory device has become a popular storage unit due to various advantages. Particularly, the data saved in the non-volatile memory device are not lost when the power is turned off. One particular example of the non-volatile memory device includes a single floating gate to retain the electrical charges associated with the saved data. When complementary metal-oxide-semiconductor field effect transistor (CMOSFET) technology is implemented, the single floating gate NVM is designed to include a field-effect transistor in a p-type well and a capacitor in a n-type well. However, the capacitor has low coupling efficiency and occupies a large circuit area, leading to large memory cell size and low cell-density. Therefore, a structure of the single non-volatile memory device and a method making the same are needed to address the above issue.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
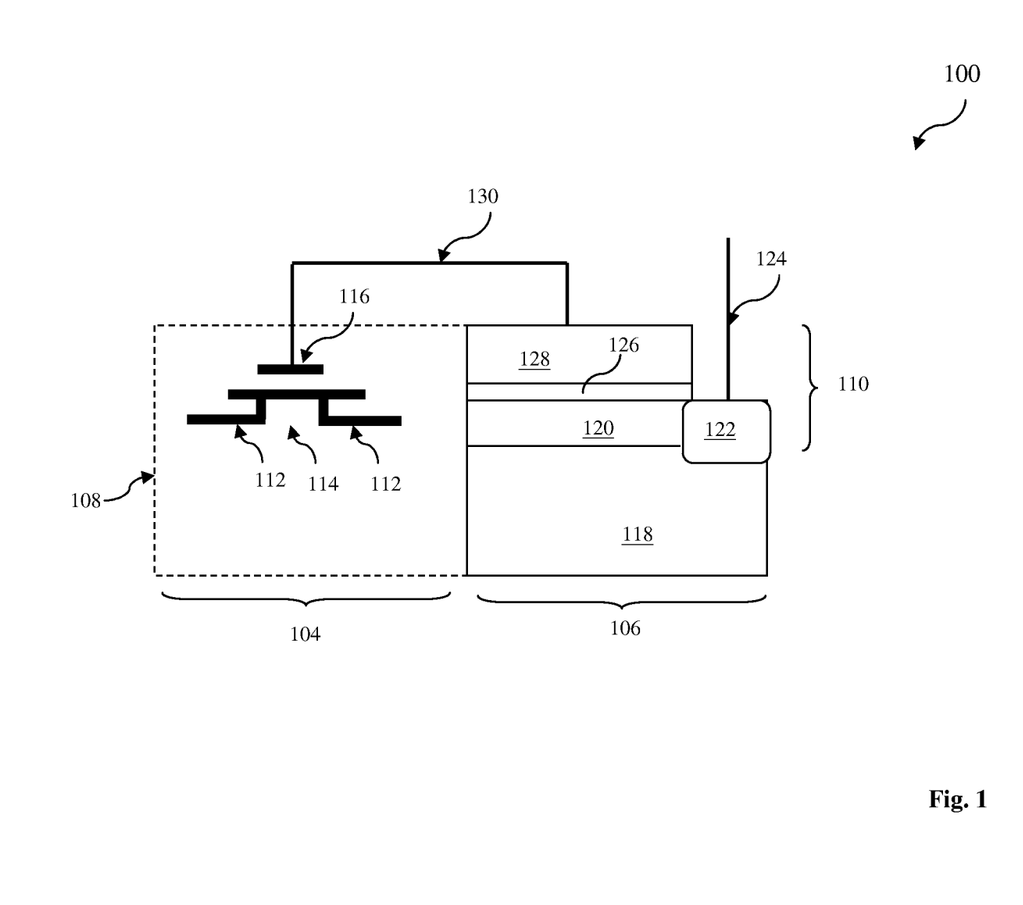
FIG. 1 illustrates one embodiment of a semiconductor structure having single floating gate non-volatile memory (NVM) device constructed according to various aspects of the present disclosure.

FIG. 1 illustrates an embodiment of a sectional view of a single floating gate non-volatile memory (NVM) device 100. The NVM device 100 is formed in a semiconductor substrate, particularly disposed in a first region 104 and a second region 106 that is approximate the first region 104. The NVM device 100 includes a data-storing structure 108 disposed in the first region 104 and a capacitor 110 in a second region 106. The data-storing structure 108 is designed to retain charges. The capacitor 110 is coupled with the data-storing structure and is configured for data operations. The data-storing structure 108 and the capacitor 110 are coupled and integrated to function as a memory unit for data storing, reading and writing. The first region 104 and the second region 106 are also referred to as the data-storing region 104 and the capacitor region 106.

In one embodiment, the data-storing structure 108 includes a field-effect transistor having a single floating gate designed to retain charges for data storing. The field-effect transistor includes source and drain features 112 in the semiconductor substrate, a channel 114 interposed between the source and drain features, and a gate 116 disposed on the channel.

In the present embodiment, the capacitor 110 has a metal-insulating-semiconductor (MIS) sandwich structure, wherein the metal and semiconductor materials serve as electrodes and the insulating material is sandwiched in the two electrodes. The NVM device 100 includes a first doped well 118 of a first-type dopant formed in the semiconductor substrate and disposed in the second region 106. The NVM device 100 further includes a second doped well 120 disposed in the second region and on the first doped well 118. The second doped well 120 is doped with a second-type dopant opposite from the first-type dopant. For example, if the first-type dopant is n-type, then the second-type dopant is p-type. In another example, if the first-type dopant is p-type, then the second-type dopant is n-type. The second doped well 120 is overlying and directly contacts the first doped region 118.

The second doped well 120 serves as an electrode of the capacitor 110. A doped feature 122 is formed in the semiconductor substrate and contacting the second doped well 120. The doped feature 122 functions as a pick-up feature (or contact) to the second doped well 120. The NVM device 100 further includes a conductive routing 124 (such as a contact feature in an interconnect structure) configured to connect the doped feature 122 to an integrated circuit input such that the second doped well 120 can be properly biased for various capacitor operations, such as charging or discharging. The doped feature 122 is heavily doped for reduced contact resistance between the second doped well 120 and the conductive routing 124. In one example, the doped feature 122 is doped with the second-type dopant. In an alternative example, the doped feature 122 is doped with the first-type dopant.

A dielectric material layer 126 is disposed on the semiconductor substrate, specifically, disposed on the second doped well 120. The dielectric material layer 126 includes silicon oxide, and/or a dielectric material having a high dielectric constant (high k dielectric material).

A conductive material layer 128 is disposed on the dielectric material layer 126. In the present embodiment, the conductive material includes a metal, such as aluminum, copper, tungsten and/or other suitable conductive material. The dielectric material layer 126 and the conductive material layer 128 are patterned to form a stack on the second doped well 120. The dielectric material layer 126, the conductive material layer 128 and the second doped well 120 forms the capacitor 110 having a MIS structure.

In an alternative embodiment, the conductive material layer 128 includes doped polysilicon or doped amorphous silicon such that the capacitor 110 has a semiconductor-insulating-semiconductor (SIS) sandwich structure.

The conductive material layer 128 serves as one electrode to the capacitor 110 and is connected to the data-storing structure 108 through an electric routing 130 (such as a portion of the interconnect structure). Particularly, the conductive material layer 128 is similar to the gate electrode of the transistor in the data-storing structure 108 in terms of composition and formation. Furthermore, the conductive material layer 128 is connected to the gate electrode 116 and serves as the floating gate of the NVM device 100.

In one embodiment, the second doped well 120 is formed after the formation of the floating gate (the conductive material layer 128). In furtherance of the embodiment, the ions are introduced to the semiconductor substrate through the conductive material layer 128, forming the second doped well 120.

Thus designed NVM device 100 enables the capacitor 110 to be operated in the enhancement mode. During the operations, the capacitor 100 is further biased such that the capacitor 100 is in the enhancement mode instead of the depletion mode. A voltage V applied to the doped feature 122 is measured as the voltage from the doped feature 122 to the conductive material layer 128. In one embodiment where the first doped well 118 is a n-type well and the second doped well 120 is a p-type well, the voltage V applied to the doped feature 122 is positive to keep the capacitor 110 in the enhancement mode. In another embodiment where the first doped well 118 is a p-type well and the second doped well 120 is a n-type well, the voltage V applied to the doped feature 122 is negative to keep the capacitor 110 in the enhancement mode.

As the capacitor 110 is in the enhancement mode, the capacitor 110 has a high concentration of the electric carriers. The coupling efficiency and capacitance are increased since the effective distance between the two electrodes of the capacitor is reduced.

In the present embodiment, the transistor of the data-storing structure 108 is formed in a third doped well of the second-type dopant. The third doped well is disposed in the first region 104. Furthermore, the third doped well 108 is separated from the second doped well 120 by an isolation mechanism. The biasing condition to the second doped well 120 will not directly impact the third doped well through direct coupling between those two wells. In one example, a dielectric isolation feature, such as a shallow trench isolation (STI) feature, is formed between the second and the third doped wells such that the third doped well is isolated from the second doped well. In another example, a fourth doped well of the first-type dopant is formed between the second and the third doped wells to provide a junction isolation between the second and third doped wells. In yet another example, the first doped well 118 is formed such that the first doped well is extended up between the second and third doped wells. Thus, the second doped well 120 is separated and isolated from the third doped well by the first doped well 118 through the junction isolation.

Figure 2:
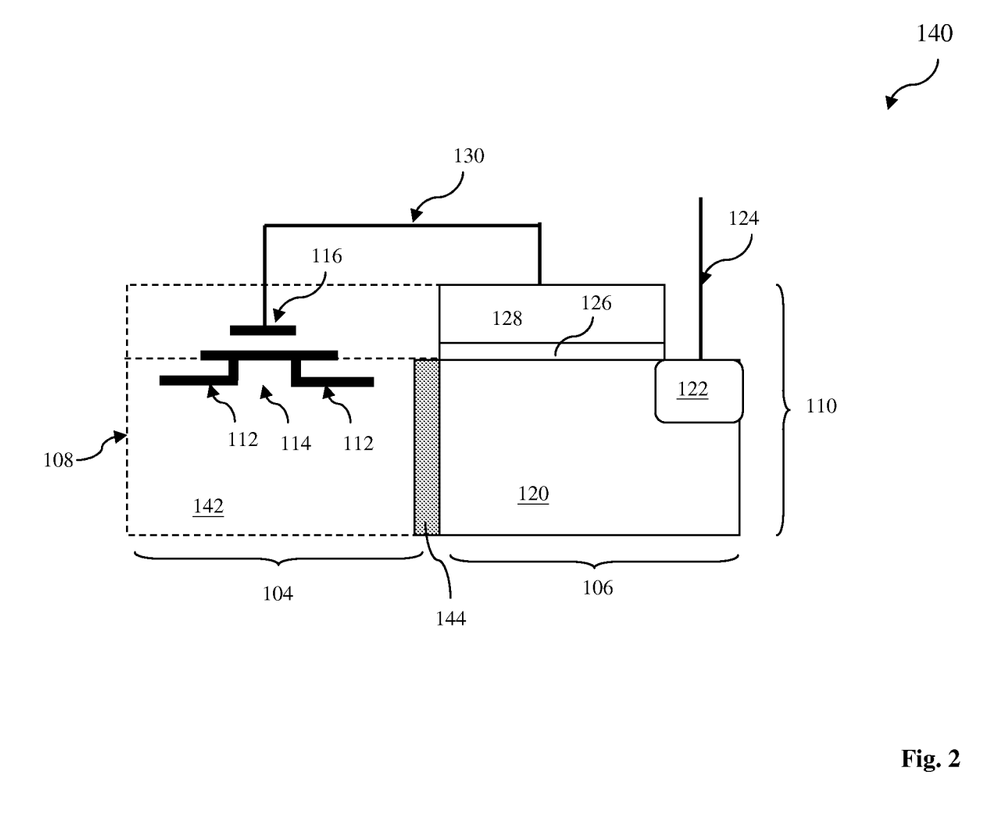
FIG. 2 illustrates another embodiment of a semiconductor structure having single floating gate NVM device constructed according to various aspects of the present disclosure.

FIG. 2 illustrates another embodiment of a sectional view of a single floating gate non-volatile memory (NVM) device 140. The NVM device 140 is formed in a semiconductor substrate, particularly disposed in a first region 104 and a second region 106 that is approximate the first region 104. The NVM device 140 includes a data-storing structure 108 disposed in the first region 104 and a capacitor 110 in a second region 106. The data-storing structure 108 and the capacitor 110 are coupled and integrated to function as a memory unit for data storing, reading and writing.

In one embodiment, the data-storing structure 108 includes a field-effect transistor having a single floating gate designed to retain charges for data storing. The field-effect transistor includes source and drain features 112 in the semiconductor substrate, a channel 114 interposed between the source and drain features, and a first gate 116 disposed on the channel. The data-storing structure 108 includes a first doped well 142 of a first-type dopant formed in the semiconductor substrate. The first doped well 142 is disposed in the first region 104 and the transistor of the data-storing structure 108 is formed in the first doped well. Accordingly, the channel 114 is doped with the first-type dopant while the source and drain features 112 are doped with a second-type dopant opposite from the first-type dopant.

In the present embodiment, the capacitor 110 has a gate stack disposed on a doped well. The capacitor 110 has a metal-insulating-semiconductor (MIS) sandwich structure, wherein the metal and semiconductor materials serve as electrodes and the insulating material is sandwiched in the two electrodes. The NVM device 140 includes a second doped well 120 of the first-type dopant. The second doped well 120 is formed in the semiconductor substrate and is disposed in the second region 106. The second doped well 120 serves as an electrode of the capacitor 110.

Particularly, the first doped well 142 is separated and isolated from the second doped well 120 by an isolation feature 144. The first and second doped wells (142 and 120) do not contact each other. Thus, the biasing condition to the second doped well 120 will not directly impact the first doped well 142 through direct coupling between those two wells. In one example, the isolation feature 144 includes a dielectric isolation feature, such as shallow trench isolation (STI). In another example, the isolation feature 144 includes a doped well of the second-type dopant to provide a junction isolation between the first and second doped wells. In yet another example, a third doped well of the second-type dopant is formed underlying the second doped well 120 within the second region 106 and is extended up between the first and second doped wells.

A doped feature 122 is formed in the semiconductor substrate and contacting the second doped well 120. The doped feature 122 functions as a pick-up feature (or contact) to the second doped well 120. The NVM device 100 further includes a conductive routing 124 (such as a contact feature in an interconnect structure) configured to connect the doped feature 122 to an integrated circuit input such that the second doped well 120 can be properly biased for various capacitor operations. The doped feature 122 is heavily doped for reduced contact resistance between the second doped well 120 and the conductive routing 124. In one example, the doped feature 122 is doped with the second-type dopant. In an alternative example, the doped feature 122 is doped with the first -type dopant.

A dielectric material layer 126 is disposed on the semiconductor substrate, specifically, disposed on the second doped well 120. The dielectric material layer 126 includes silicon oxide, and/or a dielectric material having a high k dielectric material.

A conductive material layer 128 is disposed on the dielectric material layer 126. In the present embodiment, the conductive material includes a metal, such as aluminum, copper, tungsten, or other suitable conductive material. The dielectric material layer 126 and the conductive material layer 128 are patterned to form a second gate stack on the second doped well 120. The dielectric material layer 126, the conductive material layer 128 and the second doped well 120 forms the capacitor 110 having a MIS structure.

In an alternative embodiment, the conductive material layer 128 includes doped polysilicon or doped amorphous silicon such that the capacitor 110 has a semiconductor-insulating-semiconductor (SIS) sandwich structure.

The conductive material layer 128 serves as one electrode to the capacitor 110 and is connected to the data-storing structure 108 through an electric routing 130 (such as a portion of the interconnect structure). Particularly, the conductive material layer 128 is similar to the gate electrode 116 of the transistor in the data-storing structure 108 in terms of composition and formation. Furthermore, the conductive material layer 128 is connected to the gate electrode 116.

In one embodiment, the second doped well 120 is formed after the formation of the floating gate (the conductive material layer 128). In furtherance of the embodiment, the ions are introduced to the semiconductor substrate through the conductive material layer 128, forming the second doped well 120.

Similarly, thus designed NVM device 100 enables the capacitor 110 to be operated in the enhancement mode. During the operations, the capacitor 100 is further biased such that the capacitor 100 is in the enhancement mode instead of the depletion mode. A voltage V applied to the doped feature 122 is measured as the voltage from the doped feature 122 to the conductive material layer 128. In one embodiment where the second doped well 120 is a p-type well, the voltage V applied to the doped feature 122 is positive to keep the capacitor 110 in the enhancement mode. In another embodiment where the second doped well 120 is a n-type well, the voltage V applied to the doped feature 122 is negative to keep the capacitor 110 in the enhancement mode. As in the enhancement mode, the capacitor 110 has a high concentration of the electric carriers. The coupling efficiency and capacitance are increased.

Figure 3:
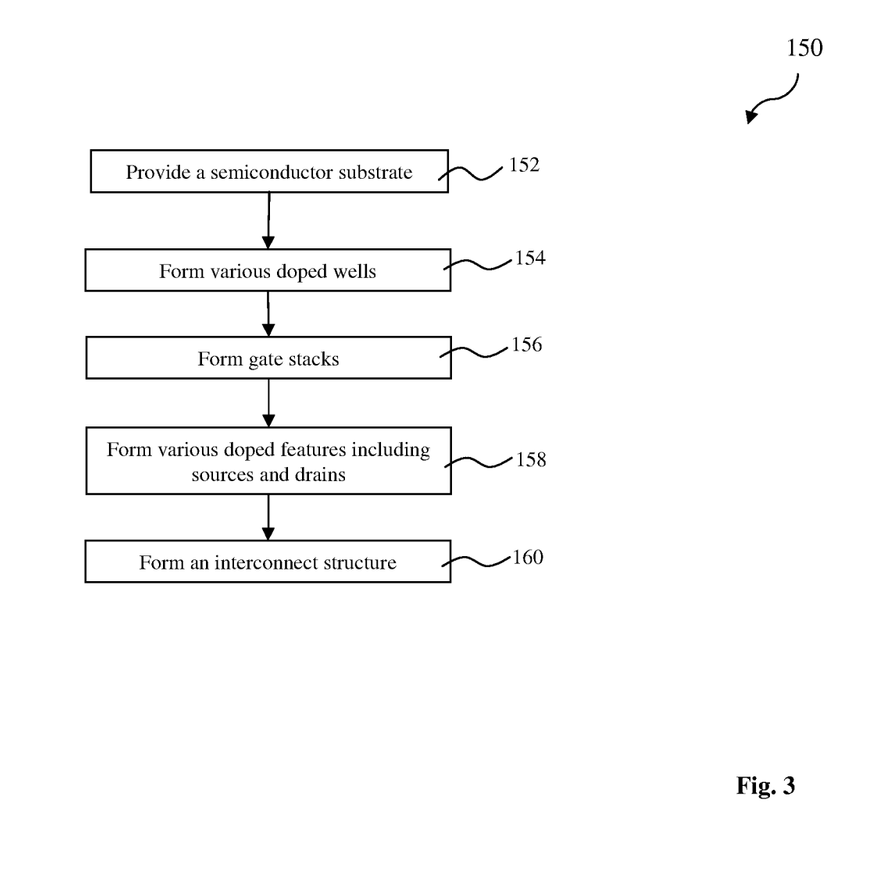
FIG. 3 is a flowchart of a method making a semiconductor device having a single floating NVM device constructed according to various aspects of the present disclosure.
Figure 4:
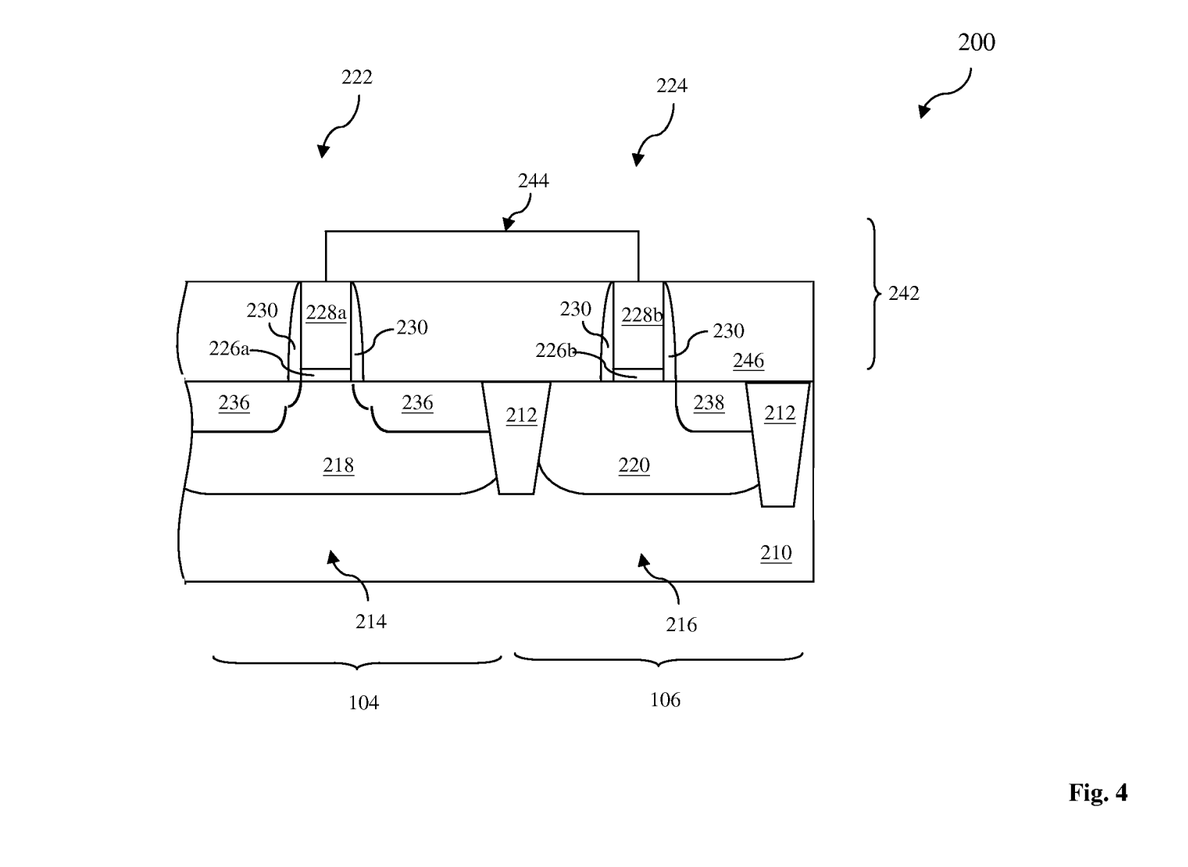
FIG. 4 illustrates another embodiment of a semiconductor structure having single floating gate NVM device constructed according to various aspects of the present disclosure.

FIG. 3 is a flowchart of an embodiment of a method 150 making a semiconductor structure having a single floating gate non-volatile memory device constructed according to various aspects of the present disclosure. FIG. 4 is a sectional views of a semiconductor structure 200 having a single floating gate non-volatile memory (NVM) device constructed according to one or more embodiments. The semiconductor structure 200 and the method 150 of making the same are collectively described with reference to FIGS. 3 and 4.

The method 150 begins at step 152 by providing a semiconductor substrate 210. The semiconductor substrate 210 includes silicon. Alternatively or additionally, the substrate 210 includes germanium, silicon germanium or other proper semiconductor materials. The semiconductor substrate 210 also includes various isolation features such as shallow trench isolation (STI) features 212 formed in the substrate to separate various devices. In the present embodiment, the substrate 210 includes a first region 104 for a data-storing structure 214 and a second region 106 for a capacitor 216. One STI feature 212 is formed between the first region 104 and the second region 106 for proper electrical isolation. The formation of the STI features may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The method 150 proceeds to step 154 by forming various doped wells in the semiconductor substrate 210. In the present embodiment, a first doped well 218 is formed in the first region 104 and a second doped well 220 is formed in the second region 106. The first and second wells 218 and 220 both are doped by a same type of dopant, such as both n-type doped or p-type doped. In one example that the first and second doped wells 218 and 220 are p-type doped, the doping species include boron (B), boron fluoride (BF2), gallium (Ga) or indium (In). In another example that the first and second doped wells 218 and 220 are n-type doped, the doping species include phosphorous (P), or arsenic (As).

The first and second wells 218 and 220 are configured to be separated and isolated from each other by the STI feature 212. Particularly, the STI feature 212 is designed to have a height extended beyond the two respective wells (218 and 220) such that two wells do not contact each other. The first and second doped wells 218 and 220 are formed by a proper technique, such as ion implantation. In one example, the ion implantation is implemented to form the two wells 218 and 220 prior to the formation of gate stacks. Alternatively, the ion implantation is implemented to form the two wells 218 and 220 after the formation of gate stacks such that the ions are introduced into the semiconductor substrate through the gate stacks.

The method 150 proceeds to step 156 by forming a first gate stack 222 in the first region 104 and a second gate stack 224 in the second region 104. In one embodiment, the first and second gate stacks 222 and 224 are simultaneously formed in a same processing procedure. The first gate stack 222 includes a first gate dielectric feature 226a and a first gate electrode 228a stacked on the first gate dielectric feature. Similarly, the second gate stack 224 includes a second gate dielectric feature 226b and a second gate electrode 228b stacked on the second gate dielectric feature.

In the present embodiment, various material layers, including a gate dielectric layer 226 and a gate electrode layer 228 are formed on the substrate 210 by various deposition technique. Then a lithography patterning process is applied to the various material layers to pattern thereof, forming the first and second gate stacks 222 and 224 including respective gate dielectric features (226a and 226b) and gate electrodes (228a and 228b). In one example, the gate dielectric layer 226 includes silicon oxide and the gate electrode layer 228 includes doped polysilicon. In another example, the gate dielectric layer 226 of silicon oxide is formed by a thermal oxidation process and the gate electrode layer 228 of polysilicon is formed by a chemical vapor deposition (CVD) method. An exemplary lithography patterning process may include photoresist patterning, etching, and photoresist stripping. The photoresist patterning may further include processing steps of photoresist coating, soft baking, mask aligning, exposing pattern, post-exposure baking, developing photoresist, and hard baking. Lithography patterning may also be implemented or replaced by other proper methods such as maskless photolithography, electron-beam writing, ion-beam writing, and molecular imprint.

In one embodiment, various gate stacks may further include gate spacers (or sidewall spacers) 230 disposed on the sidewalls of the corresponding gate electrodes and are formed at a later step. As one example, the gate spacers 230 may be formed by a procedure including dielectric material deposition and dry etch. The gate spacer 230 may includes silicon oxide, silicon nitride and/or silicon oxynitride or other suitable dielectric material.

In an alternative embodiment, the first gate stack 220 can be formed separately in a different procedure such that the first gate stack 222 are configured differently from the second gate stack 224. For example, the second gate stack 224 may not include gate spacer. In another example, the first gate dielectric feature may have a different dielectric material and/or a different thickness from those of the second gate dielectric feature.

In another alternative embodiment, the gate dielectric 226 may include a high-k dielectric material layer. The high k dielectric material layer includes a dielectric material having the dielectric constant greater than that of thermal silicon oxide, about 3.9. In one example, the high-k dielectric material layer includes hafnium oxide (HfO). In various examples, the high-k dielectric material layer includes metal oxide, metal nitride, or combinations thereof. In one embodiment, the gate electrode layer 228 includes metal, such as copper, aluminum or other suitable metal. In another embodiment, the gate stacks (e.g. 222 and 224) may further include a conductive layer interposed between the high-k dielectric layer and gate electrode layer. In one example, the conductive layer includes titanium nitride (TiN).

The first gate stack 222 is configured for the data-storing structure 214. In one embodiment, the data-storing structure 214 is a transistor, such as a field-effect transistor (FET). In one example, the transistor include a metal-oxide-semiconductor FET (MOSFET) such as n-type MOSFET or p-type MOSFET. The transistor is also referred to the numeral 214 for simplicity. The second gate stack 224 is formed for the capacitor 216. The transistor 214 and the capacitor 216 are electrically coupled and configured to form a single floating gate non-volatile memory cell (or device). Particularly, the first gate electrode 228a in the first gate stack 222 is configured to be electrically floating. There is no control gate directly stacked on the floating gate 228a. The capacitor 216 is coupled with the gate electrode 228a and further functions to control various operations to the memory cell. As illustrated in FIG. 4, the first gate electrode 228a and the second gate electrode 228b are electrically connected through the interconnect structure.

The method 150 proceeds to step 158 by forming various doped features in the semiconductor substrate 210, including source and drain features 236 in the first region 104 and a doped feature 238 in the second region 106. The source and drain 236 are formed for the transistor 214 by a proper technique, such as one or more ion implantations. In one embodiment, the source and drain features 236 further include light doped source/drain (LDD) features substantially aligned with the gate stack 222 and heavily doped source/drain (S/D) features substantially aligned with associated sidewall spacers 230. In furtherance of the embodiment, the LDD features are formed first by ion implantation with a light doping dose. Thereafter, the spacer 230 is formed by dielectric deposition and plasma etching. Then the heavily doped S/D features are formed by ion implantation with a heavy doping dose. The various source and drain features of an nFET or a pFET may be formed in a similar procedure in the substrate but with opposite doping type.

The doping type of the source/drain 236 is opposite from the doping type of the first doped well 218 such that the transistor 214 is properly configured. Specifically, the doping type of the first doped well 218 includes a first-type of dopant and the source/drain 236 includes a second type of dopant opposite from the first type of dopant. In the present embodiment, the first doped well 218 includes p-type dopant (p-well) and the source/drain 236 include n-type dopant, the corresponding transistor 214 is a n-type transistor (nFET).

In an alternative embodiment, the first doped well 218 includes n-type dopant (n-well) and the source/drain 236 include p-type dopant, the corresponding transistor 214 is a p-type transistor (pFET).

The doped feature (or pick-up feature) 238 is also formed in the second region 106 216 to serve as a contact (or pick-up) to the second doped well 220 for providing electric bias to the second doped well 220. The doped feature 238 is disposed at the edge of the gate stack 224 at one side. The doped feature 238 contacts the second doped well 220 or disposed in the second doped well 220. Alternatively, the doped feature 238 may be disposed on the both sides of the gate stack 224. In one embodiment, the doped feature 238 includes the first type of dopant same to that of the second doped well 220 but with a higher doping concentration. In an alternative embodiment, the doped feature 238 is similar to the source/drain 236 and includes the second type of dopant opposite from the first type of dopant.

In one embodiment, the doped feature 238 is simultaneously formed in the same ion implantation procedure to form the source/drain 236. For example, the doped feature 238 may include a light doped feature and a heavily doped feature of the same type dopant, similar to those of the source/drain 236. In another embodiment, the doped feature 238 is simultaneously formed in the same ion implantation procedure to form source/drain features of the same doping type in other circuit regions.

The doped well 220 serves as one capacitor electrode and the second gate electrode 228b is another capacitor electrode. The gate dielectric feature 226b is the capacitor dielectric layer sandwiched between the two capacitor electrodes.

Referring to FIG. 3, the method 150 proceeds to step 160 by forming an interconnect structure 242. The interconnect structure 242 includes vertical interconnects, such as conventional vias or contacts, and horizontal interconnects, such as metal lines. The various interconnect features may implement various conductive materials including copper, tungsten and/or silicide. In one example, a damascene process is used to form copper related multilayer interconnect structure. In another embodiment, tungsten is used to form tungsten plug in the contact holes. Various interconnect features are not shown in FIG. 4 for simplicity.

The interconnect structure 242 includes various conductive features 244 configured to electrically connect the gate electrodes 228a and 228b and further configured such that the gate electrodes 228a and 228b are electrically floating (not operable and accessible to voltage bias). The conductive features 244 are only schematically illustrated in FIG. 4.

Particularly, in another example, an inter-level dielectric (ILD) layer 246 is first formed on the semiconductor substrate 210 and the gate stacks 222/224. The ILD layer 246 is formed by a suitable technique, such as chemical vapor deposition (CVD). For example, a high density plasma CVD can be implemented to form the ILD layer 246. The ILD layer 246 is formed on the substrate to a level above the top surface of the gate stacks 222/224 such that the gate stacks 222/224 are embedded in. In various embodiments, the ILD layer 246 includes silicon oxide, low-k dielectric material (dielectric material with dielectric constant less than about 3.9, the dielectric constant of the thermal silicon oxide). In one embodiment, a chemical mechanical polishing (CMP) process is further applied to the ILD layer 246 to planarize the top surface of the ILD layer 246. In another embodiment, the CMP process may further reduce the thickness of the ILD layer 246 such that the gate stacks 222/242 are exposed from the top side.

A plurality of contact features are formed in the ILD layer 246 and are aligned with various contact regions including the source and drain 236 of the transistor 214 in the first region 104 and the doped feature 238 in the second region 216 such that those contact regions are exposed. The formation of the contact features may include etching to form contact holes and filling the contact holes with one or more metal, resulting contact features or metal plugs.

Thereafter, various metal lines and via features may be formed on the ILD layer 246 after the formation of the ILD layer 246 and the contact features. The formation of the metal lines and via features may include damascene process (single or dual damascene process), such as those used to form copper interconnect structure. The formation of the metal lines and via features may include metal etching such as those used to form aluminum interconnect structure. Other processing steps may be implemented before, during and/or after the formation of the semiconductor structure 200.

The single floating gate NVM device in the semiconductor structure 200 includes the transistor 214 and the capacitor 216 integrated such that the first gate electrode 228a and the second gate electrode 228b are connected. Especially, the transistor 214 is formed in the first doped well 218 and the capacitor 216 is formed in the second doped well 220. The first and second doped wells 218 and 220 are doped of the same type dopant (the first-type dopant). The first and second doped wells 218 and 220 are separated and isolated by the isolation feature 212. In the present embodiment, the isolation feature 212 is a STI feature. In another embodiment, the isolation feature 212 is a doped feature to provide a junction isolation. In this case, the doped feature 212 is doped of the second-type dopant opposite from the first-type dopant. Furthermore, the single floating gate NVM device in the semiconductor structure 200 is designed such that the capacitor can be operated in the enhancement mode with increased coupling efficiency. During the operation, the pick-up feature 238 is properly biased by $V_{CG}$ to enable the enhancement mode. The bias $V_{CG}$ is the voltage applied to the pick-up feature 238 relative to the second gate electrode 228b. Specifically, when the second doped well 220 is p-type doped, $V_{CG}$ is positive. When the second doped well 220 is n-type doped, $V_{CG}$ is negative.

Although the semiconductor structure 200 and the method 150 are described, other alternatives and embodiments can be present without departure from the scope of the present disclosure. For example, the single floating gate non-volatile memory device may have other suitable structures for operating the capacitor in the enhancement mode according to various other embodiments and further provided below.

Figure 5:
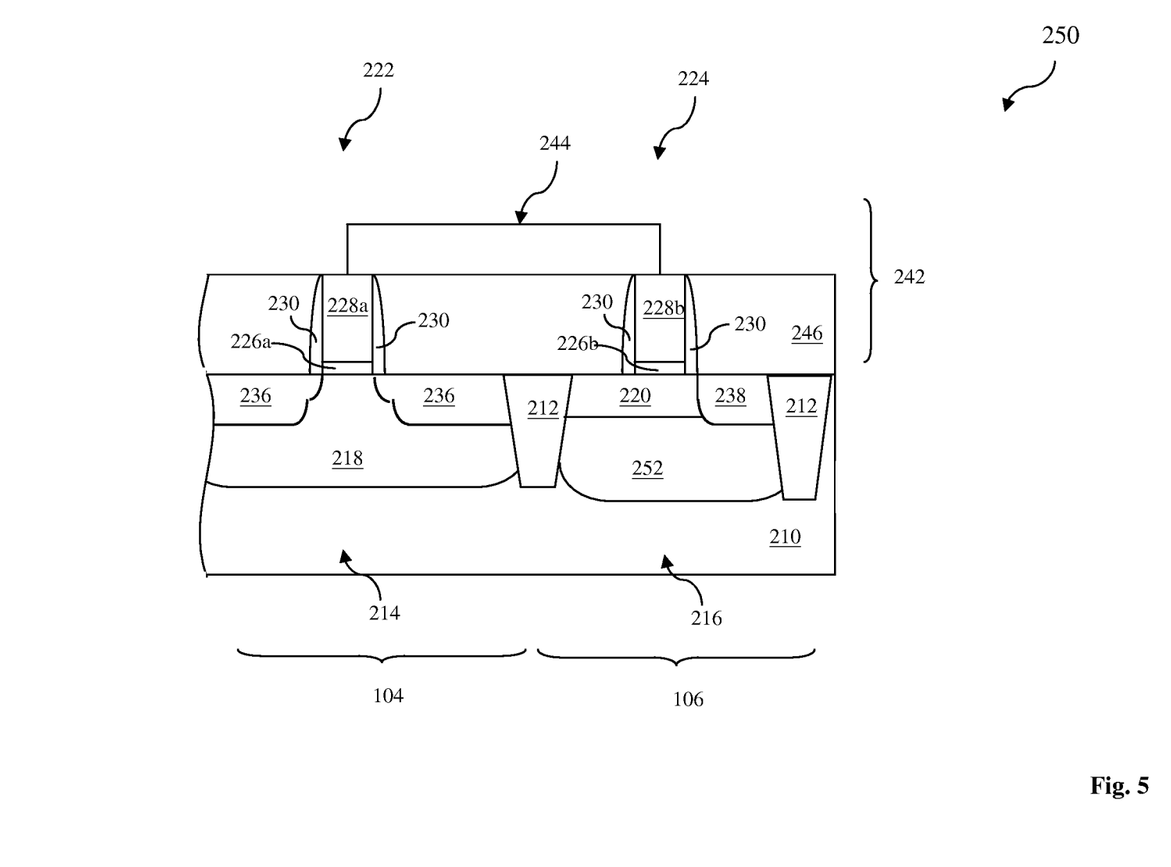
FIG. 5 illustrates another embodiment of a semiconductor structure having single floating gate NVM device constructed according to various aspects of the present disclosure.

FIG. 5 illustrates a sectional view of the semiconductor structure 250 having a floating gate non-volatile memory device constructed according to another embodiment. The floating gate non-volatile memory device includes a transistor 214 in a first region 104 and a capacitor 216 in a second region 106 integrated together. The semiconductor structure 250 is similar to the semiconductor structure 200 in terms composition, formation and configuration. However, the doped wells are designed and configured differently from those in the semiconductor structure 200. A detailed description is given below. Similar features are not further described below for simplicity.

The transistor 214 is formed in the first doped well 218 and the capacitor 216 is formed in the second doped well 220. The first and second doped wells 218 and 220 are doped of the same type dopant (the first-type dopant). The first and second doped wells 218 and 220 are separated and isolated by the isolation feature 212. In the present embodiment, the isolation feature 212 is a STI feature. In another embodiment, the isolation feature 212 is a doped feature to provide a junction isolation. In this case, the doped feature 212 is doped of the second-type dopant opposite from the first-type dopant.

The semiconductor structure 250 further includes a third doped well 252 formed in the second region 106. The third doped well 252 includes the second-type dopant opposite from the first-type dopant. The third doped well 252 is disposed underlying the second doped well 220. In one embodiment, the third doped well 252 is formed in the second region 106. Then the second doped well 220 is formed in the third doped well 252. In one example, the second doped well 220 is formed before the formation of the gate stack 224. In another example, the second doped well 220 is formed after the formation of the gate stack 224 where the doping species are introduced to the second well 220 through the gate stack 224 by an ion implantation.

Furthermore, the single floating gate NVM device in the semiconductor structure 250 is designed such that the capacitor 216 can be operated in the enhancement mode with increased coupling efficiency. During the operation, the pick-up feature 238 is properly biased by $V_{CG}$ to enable the enhancement mode. Specifically, when the second doped well 220 is p-type doped, $V_{CG}$ is positive. When the second doped well 220 is n-type doped, $V_{CG}$ is negative.

Figure 6:
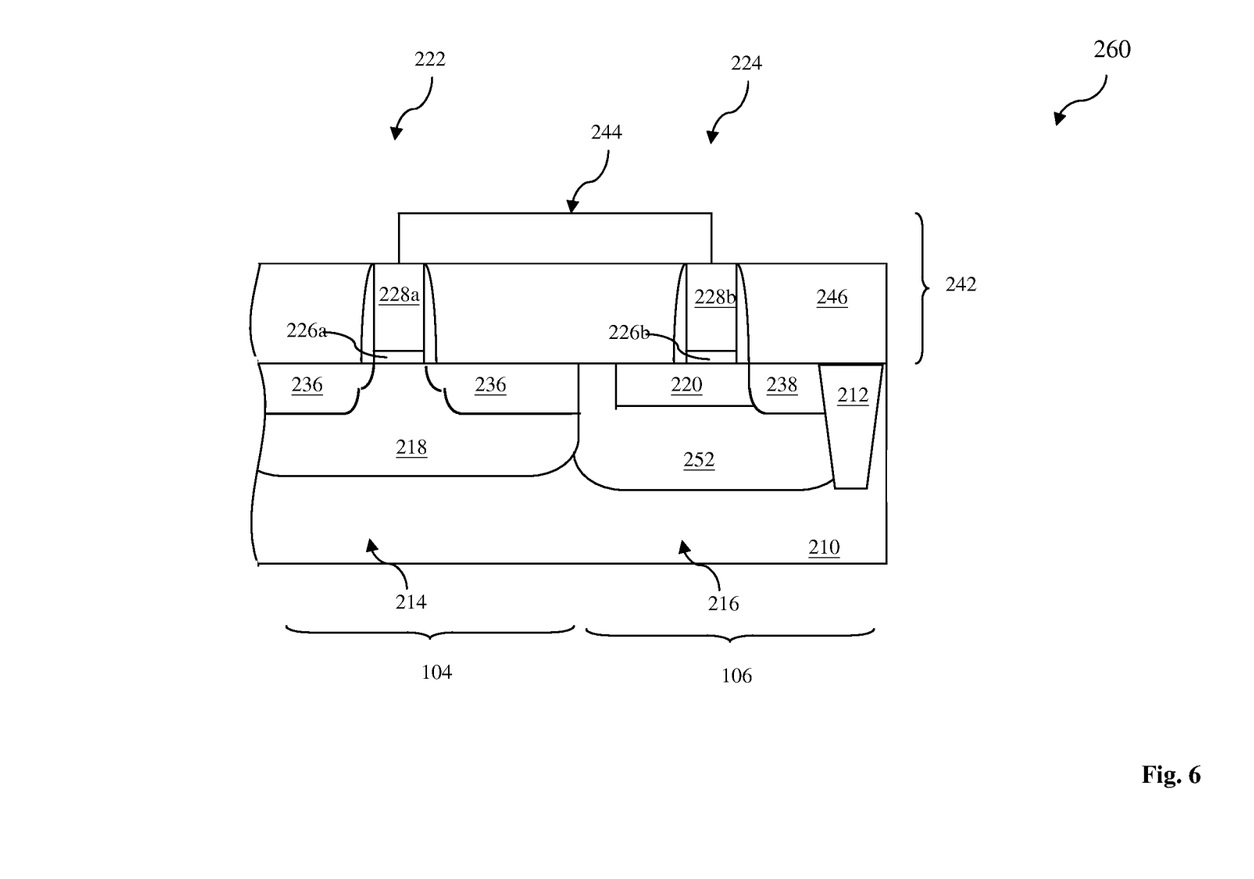
FIG. 6 illustrates another embodiment of a semiconductor structure having single floating gate NVM device constructed according to various aspects of the present disclosure.

FIG. 6 illustrates a sectional view of the semiconductor structure 260 having a floating gate non-volatile memory device constructed according to another embodiment. The floating gate non-volatile memory device includes a transistor 214 in a first region 104 and a capacitor 216 in a second region 106 integrated together. The semiconductor structure 260 is similar to the semiconductor structure 250 in terms composition, formation and configuration. However, the third doped well 252 is designed to be extended between the first doped well 218 and the second doped well 220 to provide junction isolation between the first and second doped wells 218 and 220. Accordingly, the dielectric isolation, such as STI feature, between the first and second doped wells may be eliminated. In another embodiment, the third doped well 252 is greater than the second doped well 220 in size, in a top view, such that the second doped well 220 is embedded in and is encompassed by the third doped well 252. Similar features and steps (fabrication and/or operation) are not further described for simplicity. For example, when the second doped well 220 is p-type doped, $V_{CG}$ is positive. When the second doped well 220 is n-type doped, $V_{CG}$ is negative.

In various embodiments of the semiconductor structure, the single floating gate non-volatile memory device is designed to enable the capacitor in the enhancement mode. Particularly, during operations, the pick-up feature of the capacitor is properly biased by a voltage $V_{CG}$ (the voltage from the pick-up feature to the gate electrode in the capacitor region) to enable the enhancement mode. Specifically, when the second gate stack in the capacitor region is disposed in a p-type well, $V_{CG}$ is positive. When the second gate stack in the capacitor region is disposed in a n-type well, $V_{CG}$ is negative. As the capacitive coupling efficiency is increased by enabling the enhancement mode, not necessarily by increasing the capacitor area, the disclosed semiconductor structure in various embodiments achieves the increased packing density.

Thus, the present disclosure provides a non-volatile memory (NVM) device. The NVM device includes a semiconductor substrate having a first region and a second region.

The second region is approximate the first region. The NVM device includes a data-storing structure formed in the first region and designed operable to retain charges. The NVM device also includes a capacitor formed in the second region and coupled with the data-storing structure for data operations. The data-storing structure includes a first doped well of a first-type dopant in the semiconductor substrate. The data-storing structure also includes a first gate dielectric feature on the first doped well. The data-storing structure also includes a first gate electrode disposed on the first gate dielectric feature and configured to be floating. The capacitor includes a second doped well of the first-type dopant and formed in the semiconductor substrate. The capacitor includes a second gate dielectric feature on the second doped well. The capacitor also includes a second gate electrode disposed on the second gate dielectric feature and connected to the first gate electrode.

In one embodiment of the NVM device, the first doped well is isolated from the second doped well by an isolation feature. In one example, the isolation feature includes a dielectric feature that is formed in the semiconductor substrate and is interposed between the first and second doped wells. In another example, the isolation feature includes a doped feature of a second-type dopant opposite from the first-type dopant, wherein the doped feature is formed in the semiconductor substrate and is interposed between the first and second doped wells.

In another embodiment, the NVM device further includes a third doped well of a second-type dopant opposite from the first-type dopant, wherein the third doped well is formed in the semiconductor substrate within the second region and is underlying the second doped well. In one example, the third doped well is extended between the first and second doped wells and separates the first doped well from the second doped well.

In yet another embodiment, the NVM device further includes a heavily doped feature contacting the second doped well and designed as a pick-up electrode for voltage biasing.

In another embodiment, the data-storing structure further includes source and drain features of a second-type dopant opposite from the first-type dopant, wherein the source and drain features are formed in the first doped well and are disposed on both sides of the first gate electrode. In one example, the first-type dopant is a p-type dopant; the second-type dopant is a n-type dopant; and the data-storing structure includes a n-type filed-effect transistor. In another example, the first-type dopant is a n-type dopant; the second-type dopant is a p-type dopant; and the data-storing structure includes a p-type filed-effect transistor.

In yet another embodiment, the first doped well directly contacts the first gate dielectric feature; and the second doped well directly contacts the second gate dielectric feature.

The present disclosure also provides another embodiment of a non-volatile memory (NVM) device. The NVM device includes a semiconductor substrate that has a first region and a second region. The second region is approximate the first region. The NVM device also includes a data-storing structure formed in the first region and designed operable to retain charges. The NVM device also includes a capacitor formed in the second region and coupled with the data-storing structure. The capacitor includes a first doped well of a first-type dopant and formed in the semiconductor substrate. The capacitor also includes a second doped well of a second-type dopant opposite from the first-type dopant and formed in the semiconductor substrate. The second doped well is on and directly contacts the first doped well. The capacitor also includes a first gate dielectric feature on the second doped well. The capacitor includes a first gate electrode disposed on the first gate dielectric feature.

In one embodiment, the data-storing structure further includes a third doped well of the second-type dopant, wherein the third doped well is formed in the semiconductor substrate within the first region and is isolated from the second doped well.

In one example, the first doped well is laterally surrounding the second and is configured to separate the third doped well from the second doped well. In another example, the NVM device further includes a shallow trench isolation (STI) feature that is interposed between the second and third doped wells and is configured to isolate the third doped well from the second doped well.

In another example, the data-storing structure further includes a second gate dielectric feature on the third doped well. The data-storing structure also includes a second gate electrode disposed on the second gate dielectric feature. The data-storing structure may further include source and drain features of the first-type dopant. The source and drain features are formed in the third doped well and are disposed on both sides of the second gate electrode.

In another embodiment, the NVM device further includes a doped feature disposed in the second region and contacting the second doped well.

The present disclosure also provides one embodiment of a method for a non-volatile memory (NVM) device. The method includes providing a semiconductor substrate that has a first region and a second region. The second region is approximate the first region. The method includes forming a first doped well in the first region; forming a second doped well in the second region. The first and second doped wells are of a first-type dopant and are isolated from each other. The method also includes forming a data-storing structure in the first doped well. The data-storing structure includes a first gate stack. The method also includes forming a second gate stack on the second doped well, resulting in a capacitor.

In one embodiment, the forming a data-storing structure include forming a first gate dielectric feature in the first region. The forming a data-storing structure includes forming a first gate electrode on the first gate dielectric feature. The forming a data-storing structure includes forming source and drain features in the first doped well. The source and drain feature are disposed on both sides of the first gate electrode. The forming a second gate stack includes forming a second gate dielectric feature. The forming a second gate stack includes forming a second gate electrode on the second gate dielectric feature. The forming a second gate stack also includes forming a doped feature in the semiconductor substrate. The doped feature is within the second region and contacts the second doped well.

In another embodiment, the method further includes forming a third doped well of a second-type dopant such that the third doped well is underlying and contacts the second doped well.

In yet another embodiment, the forming a second doped well includes implementing an implantation process to form the second doped well underlying the second gate stack after the forming of the first gate stack and the second gate stack.

In yet another embodiment, the doped feature is operable to be electrically biased for charging or discharging the capacitor. In one embodiment, during operating the NVM device, the doped feature is biased such that the capacitor is in an enhancement mode. In furtherance of the embodiment, when the second doped well is a p-type well, a positive voltage is applied to the doped feature relative to the second gate electrode. When the second doped well is a n-type well, a negative voltage is applied to the doped feature relative to the second gate electrode.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A non-volatile memory (NVM) device, comprising:
   a semiconductor substrate having a first region and a second region approximate the first region;
   a data-storing structure formed in the first region and designed operable to retain charges, wherein the data-storing structure includes:
     a first doped well of a first-type dopant disposed in the semiconductor substrate,
     a first gate dielectric feature disposed on the first doped well, and
     a first gate electrode disposed on the first gate dielectric feature and configured to be floating; and
   a capacitor formed in the second region and coupled with the data-storing structure for data operations, wherein the capacitor includes:
     a second doped well of the first-type dopant disposed in the semiconductor substrate,
     a second gate dielectric feature disposed on the second doped well, and
     a second gate electrode disposed on the second gate dielectric feature and connected to the first gate electrode; and
   a third doped well of a second-type dopant opposite from the first-type dopant, wherein the third doped well is disposed in the semiconductor substrate within the second region and is underlying the second doped well.

2. The NVM device of claim 1, wherein the first doped well is isolated from the second doped well by an isolation feature.

3. The NVM device of claim 2, wherein the isolation feature includes a dielectric feature that is formed in the semiconductor substrate and is interposed between the first and second doped wells.

4. The NVM device of claim 2, wherein the isolation feature includes a doped feature of a second-type dopant opposite from the first-type dopant, wherein the doped feature is formed in the semiconductor substrate and is interposed between the first and second doped wells.

5. The NVM device of claim 1, wherein the third doped well extends between the first and second doped wells and separates the first doped well from the second doped well.

6. The NVM device of claim 1, further comprising a heavily doped feature contacting the second doped well and designed as a pick-up electrode for voltage biasing.

7. The NVM device of claim 1, wherein the data-storing structure further includes source and drain features of a second-type dopant opposite from the first-type dopant, wherein the source and drain features are formed in the first doped well and are disposed on both sides of the first gate electrode.

8. The NVM device of claim 7, wherein:
   the first-type dopant is a p-type dopant;
   the second-type dopant is a n-type dopant; and
   the data-storing structure includes a n-type field-effect transistor.

9. The NVM device of claim 7, wherein:
   the first-type dopant is a n-type dopant;
   the second-type dopant is a p-type dopant; and
   the data-storing structure includes a p-type field-effect transistor.

10. The NVM device of claim 1, wherein:
    the first doped well directly contacts the first gate dielectric feature; and
    the second doped well directly contacts the second gate dielectric feature.

11. The NVM device of claim 1, wherein the third doped well physically contacts the second doped well.

12. The NVM device of claim 1, wherein the first gate dielectric feature physically contacts the first doped well, and wherein the second gate dielectric feature physically contacts the second doped well.

13. The NVM device of claim 1, wherein the third doped well physically contacts the first and second doped wells.

14. A non-volatile memory (NVM) device, comprising:
    a semiconductor substrate having a first region and a second region approximate the first region;
    a data-storing structure formed in the first region and designed operable to retain charges, wherein the data-storing structure further includes a third doped well of the second-type dopant, wherein the third doped well is formed in the semiconductor substrate within the first region and is isolated from the second doped well; and
    a capacitor formed in the second region and coupled with the data-storing structure, wherein the capacitor includes:
      a first doped well of a first-type dopant formed in the semiconductor substrate;
      a second doped well of a second-type dopant opposite from the first-type dopant and formed in the semiconductor substrate, wherein the second doped well is on and directly contacts the first doped well;
      a first gate dielectric feature on the second doped well; and
      a first gate electrode disposed on the first gate dielectric feature.

15. The NVM device of claim 14, wherein the first doped well laterally surrounds the second doped well and is configured to separate the third doped well from the second doped well.

16. The NVM device of claim 14, further comprising a shallow trench isolation (STI) feature that is interposed between the second and third doped wells and is configured to isolate the third doped well from the second doped well.

17. The NVM device of claim 14, wherein the data-storing structure further includes:
    a second gate dielectric feature on the third doped well; and
    a second gate electrode disposed on the second gate dielectric feature.

18. The NVM device of claim 17, wherein the data-storing structure further includes source and drain features of the first-type dopant that are formed in the third doped well and are disposed on both sides of the second gate electrode.

19. The NVM device of claim 14, further comprising a doped feature disposed in the second region and contacting the second doped well.

20. A non-volatile memory (NVM) device, comprising:
a semiconductor substrate having a first region and a second region that is approximate the first region;
a first doped well in the first region;
a second doped well in the second region, wherein the first and second doped wells are of a first-type dopant and are isolated from each other;
a data-storing structure in the first doped well, wherein the data-storing structure includes a first gate stack, wherein the first gate stack physically contacts the first doped well; and
a second gate stack on the second doped well, resulting in a capacitor, wherein the second gate stack physically contact the second doped well.

21. The NVM device of claim 20, wherein:
the data-storing structure includes:
a first gate dielectric feature in the first region,
a first gate electrode on the first gate dielectric feature, and
source and drain features in the first doped well and disposed on both sides of the first gate electrode.

22. The NVM device of claim 20, wherein:
the second gate stack includes:
a second gate dielectric feature,
a second gate electrode on the second gate dielectric feature, and
a doped feature in the semiconductor substrate within the second region and contacting the second doped well.

23. The NVM device of claim 20, further comprising a third doped well of a second-type dopant such that the third doped well is underlying and contacts the second doped well.

24. The NVM device of claim 23, wherein the doped feature is biased such that the capacitor is in an enhancement mode during operation of the NVM device.

25. The NVM device of claim 20, wherein the doped feature is configured operable to be electrically biased for charging or discharging the capacitor.

* * * * *